United States Patent [19]
Olsen et al.

[11] Patent Number: 5,234,758
[45] Date of Patent: Aug. 10, 1993

[54] NONLINEAR OPTICAL COMPOSITES OF METAL CLUSTER LADEN POLYMERS

[75] Inventors: Allan W. Olsen, Arlington; Zakya H. Kafafi, Alexandria, both of Va.

[73] Assignee: The United States of Americas as represented by the Secretary of the Navy, Washington, D.C.

[21] Appl. No.: 892,914

[22] Filed: Jun. 3, 1992

[51] Int. Cl.$^5$ ............................................. B32B 5/16
[52] U.S. Cl. ................................... 428/323; 428/328; 428/330; 428/425.9; 428/913; 524/439; 524/440; 524/441; 523/457; 523/458; 523/459; 252/582; 252/600
[58] Field of Search ............ 428/328, 323, 330, 425.9, 428/913; 524/439, 440, 441; 523/457, 458, 459; 252/582, 600

[56] References Cited

U.S. PATENT DOCUMENTS

| | | | |
|---|---|---|---|
| 4,828,758 | 5/1989 | Gillberg-La Force et al. | 252/582 |
| 5,023,139 | 6/1991 | Birnboim et al. | 428/402 |
| 5,026,599 | 6/1991 | Koskenmaki | 428/328 |
| 5,187,209 | 2/1993 | Hirai et al. | 523/205 |
| 5,190,990 | 3/1993 | Eichmiller | 523/137 |

*Primary Examiner*—Patrick J. Ryan
*Assistant Examiner*—Marie R. Macholl
*Attorney, Agent, or Firm*—Thomas E. McDonnell; George A. Kap

[57] ABSTRACT

Nonlinear optical composites with large third-order optical response composed of metal clusters uniformly dispersed in polymers are prepared by vapor deposition of a metal onto a cold support while simultaneously cocondensing a vapor of an organic material. Where the organic material is a monomer, it polymerizes either when it comes in contact of the metal and/or when the cold surface is warmed. The unpolymerized monomer is removed to yield a processable composite. When the organic material is a diluent, it deposits as a solid on the cold surface forming a dispersion of the solid metal clusters in the liquid diluent. A polymer solution is then mixed with the dispersion and the composite is formed after removal of the diluent and the solvent for the polymer.

5 Claims, 4 Drawing Sheets

NONLINEAR OPTICAL COMPOSITES OF METAL CLUSTER LADEN POLYMERS

FIELD OF INVENTION

This invention relates to composites of metal clusters dispersed in polymers that exhibit a third-order nonlinear optical response. More specifically, this invention relates to enhancement of nonlinear optical response of linear and nonlinear optical polymers by dispersing metal clusters, which have an inherent optical nonlinearity, in such polymers.

DESCRIPTION OF PRIOR ART

The term "nonlinear" in an optical sense has been used in the past to refer to materials which exhibit nonlinear optical (NLO) response upon exposure to intense radiation, such as that coming from an intense laser source. A nonlinear optical response occurs when a material has large second and/or third-order optical coefficient. Theoretically, all materials have NLO coefficients and thus should exhibit nonlinear optical responses. However, the intensity of radiation required for a material to respond nonlinearly classifies the materials into well defined categories of "linear" and "nonlinear" optical materials. Or stated differently, the value of the second and/or third-order optical coefficient of the material will distinguish a NLO material from a linear one. Generally, in a nonlinear optical material, light transmission characteristics change with intensity of incident light.

Enhanced third-order optical nonlinear response results in materials with large third-order optical coefficients. Those skilled in the art measure the NLO response as a function of time, wavelength, and polarization of the light beams. A number of different mechanisms, with different NLO responses have been identified for several NLO materials. Metal clusters, for example, exhibit a large resonant third-order nonlinearity due to an electronic mechanism associated with the plasmon resonance absorption band. Other materials exhibit large third-order coefficients due to thermal mechanisms. Since polarization (P)can be expressed in a power series of the optical field strength (E) as $$P = P_0 + x^1 E + x^2 E^2 + x^3 E^3 + \ldots$$

where $P_0$ = polarization in the absence of field
$x^1$ = linear susceptibility
$x^2$ and $x^3$ = second and third-order susceptibilities increasing or enhancing third-order NLO coefficient of a material results in increased polarization thereof.

U.S. Pat. No. 4,828,758 to Gillberg-La Force et al. discloses a transparent solid optical medium which is a particulate composite of a nonlinear optical polymer and a metal colloid dispersed in the polymer. U.S. Pat. No. 5,023,139 to Birnboim et al. relates to nonlinear optical materials and discloses particles on the order of $10^{-8}$ m to $10^{-9}$ m comprising a metal core and a shell of a dielectric material which exhibits a third-order NLO response. These particles are preferably suspended in a dielectric medium that may be linear or may exhibit a third-order NLO response.

SUMMARY OF INVENTION

It is an object of this invention to provide a NLO composite composed of metal clusters in a polymer matrix, said composite having higher third-order optical response than the metal-free polymer.

It is another object of this invention to prepare nonlinear optical composites of metal clusters dispersed in a polymer with large third-order optical response.

It is another object of this invention to make nonlinear optical composites by cocondensation of metal with an organic diluent onto a cold surface, and mixing it with a polymer solution.

It is another object of this invention to prepare composites of metal clusters and a linear optical or a nonlinear optical polymer by cocondensation of a metal with a polymer or its precursor on a cryogenic surface.

It is another object of this invention to prepare composites of metal clusters that are uniformly dispersed in a polymer.

It is another object of this invention to synthesize NLO composites of metal clusters in polymers with a metal volume fraction exceeding 1%.

These and other objects of this invention are accomplished by preparing a nonlinear optical composite exhibiting third-order optical response, the composite is composed of metal clusters embedded in a polymer and is made by vapor deposition of the metal onto a cryogenic surface along with vaporized monomer, the polymer precursor, or vaporized diluent for the metal clusters.

DETAILED DESCRIPTION OF INVENTION

The invention herein pertains to composites with enhanced nonlinear optical response and to methods for preparation thereof. Enhancement of as much as one million in the nonlinear optical response of composites due to the addition of metal clusters has been predicted. The composites consist of discrete metal atoms/clusters dispersed in a polymer matrix. Preparation of the composites is characterized by vapor deposition of the metal on a cold surface along with the polymer precursor or the metal cluster diluent.

Figure 1:
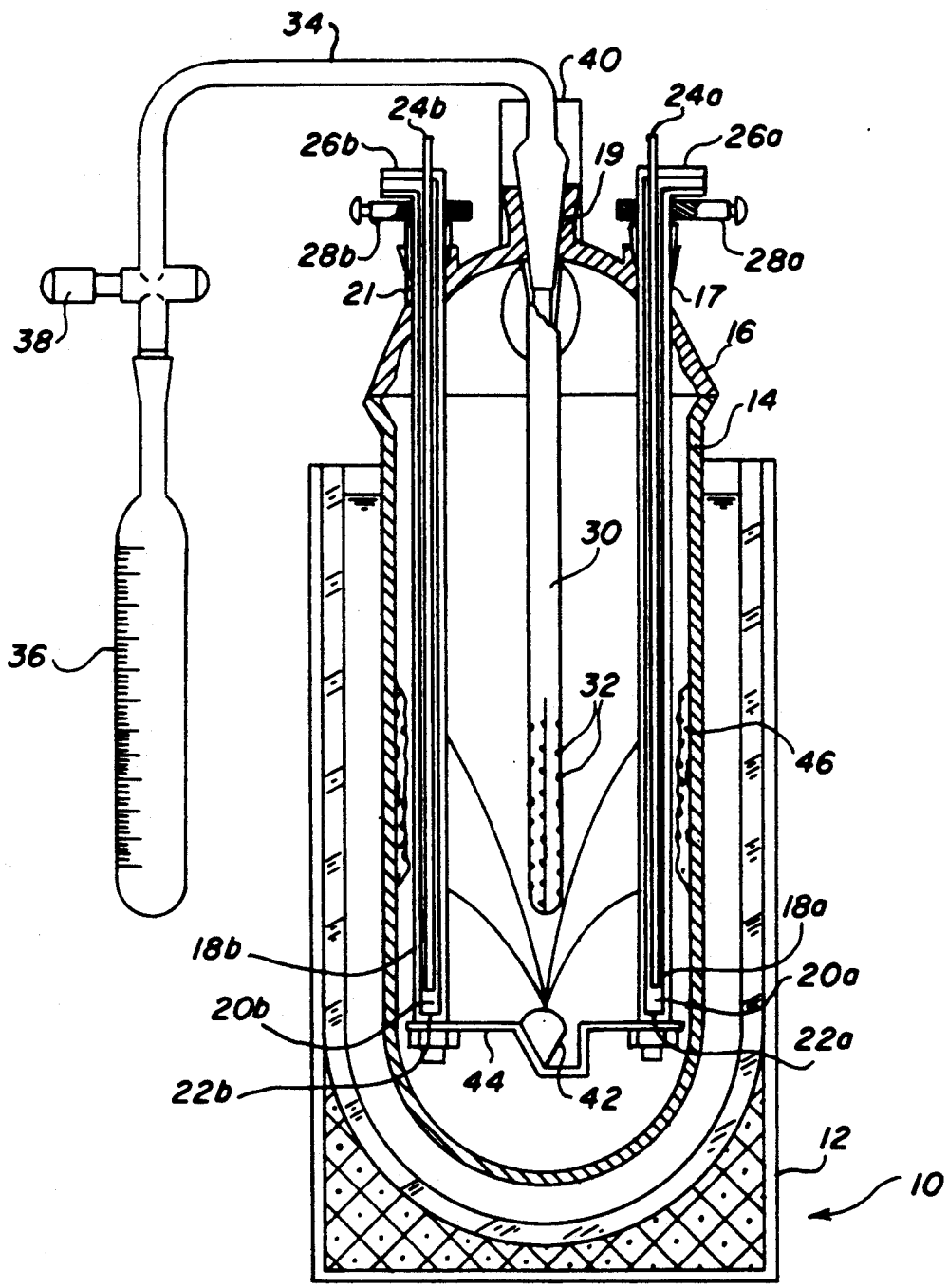
FIG. 1 is an illustration of the metal reactor used to make a nonlinear optical composite of this invention, which composite is composed of metal clusters dispersed in a polymer.

The apparatus illustrated in FIG. 1 in cross-section is used to make metal cluster/polymer composites by a number of procedures characterized by vapor deposition of a metal on a cryogenic interior surface of a reaction vessel. Reactor 10 shown in FIG. 1 includes dewar 12 and a reaction vessel disposed in a spaced relationship to dewar 12. The reaction vessel is comprised of two parts: the reactor bottom portion 14 and the reactor top portion 16. Thickness of closure or reactor top 16 is about ⅛" or about the same as the thickness of reactor bottom 14. The reactor bottom and top portions each have a ground glass flange which allows them to form a good vacuum seal from the outside atmosphere. Reactor bottom 14 is immersed in dewar 12 that can be filled with a cryogenic liquid such as liquid nitrogen. Reactor bottom 14 and reactor top 16 are transparent and it is possible to follow events in the reaction vessel visually, especially through reactor top 16. Showerhead entry 30 is a glass tube about ⅛" in outside diameter and about 1/16" in thickness. Three openings 17, 19 and 21 in reactor top 16 provide for entry of electrodes 18a, 18b and showerhead tube gas entry 30 provided with a plurality of small openings 32 at the lower extremity thereof.

Electrodes 18a and 18b are circular in cross-section and have cylindrical wells 20a and 20b extending almost the entire length of the electrodes terminating at 22a and 22b at the lower extremities of the electrodes. The electrodes are copper tubes about ⅛" in outside diameter and about 1/32" thick. The purpose of the wells 20a and 20b is for introduction of a cooling medium such as water, into the electrodes for cooling purposes. For introducing a cooling fluid into the wells, cylindrical tubes 24a and 24b are inserted into wells 20a and 20b. As the cooling fluid is introduced into the wells, the level thereof rises until it is expelled through the upper extremities of the wells. The electrodes are formed with L-shaped sections 26a and 26b to facilitate withdrawal of the cooling fluid. Power to electrodes 18a and 18b is imparted through connections 28a and 28b which lead to an electrical power source where the desired power can be regulated. Electrical power to the electrodes was imparted by means of a Kontes Martin metal atom reactor unit. Electrode connections 17 and 21 through closure 16 are hermetic.

Crucible 42, made of alumina coated tungsten, an electrically conducting metal, is disposed between the electrodes by means of a metal bracket 44 connected to electrodes 18a, 18b at the lower extremity thereof. Connections to bracket 44 are made such as to allow for electrical resistive heating of any sample placed in crucible 42.

Showerhead 30 has a hermetic connection 19 through reactor top 16 to tube 34 which delivers polymer precursor or diluent from glass bulb 36 provided with a stopcock 38. The reaction vessel can be placed under vacuum by connecting its interior of the reaction vessel to a vacuum source through line 40, which is schematically illustrated in FIG. 1.

A cooling fluid, such as liquid nitrogen, is poured inside the dewar to cool the walls of the reaction vessel. Means are also provided for heating bulb 36, and/or line or tube 34. The contents of the bulb can be heated and converted from a solid or a liquid into an organic condensable vapor.

The reaction vessel has a 3-liter capacity which, in cross-section, is circular. Outside dimensions of the apparatus are about 1½ feet by ½ foot although, its interior is cylindrical with a concave bottom or bowl-shaped with a long cylindrical skirt. The apparatus is assembled in such a way as to permit ready withdrawal of reactor bottom 14 and top 16 from the dewar so that reactor bottom 14 and its contents can be readily warmed to room temperature or higher.

In operation, reactor bottom 14 is assembled in a spaced relationship inside dewar 12, as shown in FIG. 1. Liquid nitrogen is introduced into dewar 12 and its level is maintained in order to insure constant low temperature of the walls of reactor bottom 14. Reactor top 16 is placed on top of reactor bottom 14, electrodes 18a and 18b are installed and showerhead 30 is connected to line 34. Interior of the reaction vessel is placed under a vacuum of $10^{-3}$ to $10^{-4}$ Torr (one Torr equals 1 mm of mercury). Bulb 36 and line 34 are heated, if needed, to introduce a condensable vapor into the interior of the reaction vessel through showerhead 30 and openings 32 therein. Once inside the reaction vessel, the vapors are cocondensed with metal vapor on the inside of the cryogenic surface of the bowl reactor bottom 14 of the reaction vessel. A large excess of vapors are admitted into the reaction vessel to prevent collisions between metal particles.

Simultaneously with the condensation of the vapors, a metal sample placed in crucible 42 is resistively heated to a vapor state and the metal vapor is deposited on the interior walls of reactor bottom 14. Upon coming in contact with cold surface of reactor bottom 14, metal vapor condenses in solid metal clusters. FIG. 1 shows matrix deposit 46 on the inside surface of bowl 14 which is cocondensed metal and organic vapors. At this point, the reaction vessel is allowed to warm up to room temperature and is brought to atmospheric pressure. From this point, preparation of metal cluster polymer composites differs depending on the particular procedure employed to make the composites.

The composites can be prepared using the apparatus illustrated in FIG. 1 by either Scheme I or Scheme II. In Scheme I, the reaction vessel is initially evacuated to about $10^{-3}$ to $10^{-4}$ Torr. Cocondensation of the metal vapor and the polymer precursor takes about 2 to 8 hours. A metal in the crucible is vaporized as organic condensable vapors of an organic monomer enter interior of the reaction vessel from bulb 36 and through line 34. Upon coming in contact with a cold surface, the metal and the organic vapors cocondense in a solid form. Depending on the particular metal used, the metal can act as a catalyst and initiate polymerization of the monomer. The resulting matrix that is formed on the interior walls of reactor bottom 14 of the reaction vessel consists of metal clusters dispersed in a solid monomer/polymer mixture.

The next step in Scheme I is warming up of the matrix to room temperature, which may result in further polymerization. This is then followed by bringing it to atmospheric pressure. At this point, the composite is purified by removal of the unreacted monomer. This is accomplished by washing away unreacted monomer or dissolving entire matrix and precipitating polymer with an appropriate solvent. The metal clusters tend to associate with the polymer giving rise to a final product that consists of a composite of metal clusters dispersed in a polymer matrix. Volume fraction of metal clusters in excess of 1%, preferably 2 to 20%, was attained in this work.

Scheme II is more complicated procedurally. In place of the vaporizable and condensable monomer used in Scheme I, this scheme relies on a diluent. A diluent is placed in bulb 36 and is heated, if needed, so that condensable vapors enter the reaction vessel where they condense in solid state on the cold surfaces of reactor bottom 14 of the reaction vessel. Acetone and other common organic solvents can be used as diluents.

About 50 to 200 ml of a diluent are typical by the amounts used. While the reaction vessel is immersed in liquid nitrogen, its walls are at 77K and the cocondensed diluent and metal clusters are in solid form. Amount of vaporized metal, such as gold, can be 0.001 to 0.5 g. Deposition time varies between about 2 and 8 hours. The reaction vessel is then allowed to be warmed up to ambient room temperature, the diluent becomes liquid, and a dispersion of solid metal clusters in a liquid diluent results.

The next step in Scheme II involves dissolving the polymer of interest in a suitable solvent. An example of such a solvent is tetrahydrofuran (THF). The polymer solution is then added to the metal cluster dispersion and mixed. After proper diluent/solvent removal, what remains is a composite of metal clusters dispersed in a polymer matrix where metal volume fraction is in excess of 1%, preferably 2 to 20%. This easily processable polymeric material exhibits third-order nonlinear response.

As already noted above, the composites described herein consist of a dispersion of metal clusters in a polymer. Suitable metals include alkali metals, alkaline earth metals, transition metals, lanthanides, actinides, and others. More specifically, suitable metals which can provide nonlinear optical enhancement include but are not limited to gold, silver, platinum, nickel, palladium, rhodium, iridium, copper, aluminum, gallium, zinc, cadmium and mixtures thereof. Metal derivatives are also suitable for purposes herein. Preferred metals are the noble metals gold, silver, and platinum.

The metal clusters generally range in diameter from about 10 angstroms to about 200 angstroms, depending on the particular metal used. Metal volume fraction, i.e., metal content in the composite on volume percent basis can be as high as 25%, preferably 2 to 20%.

Various polymers and precursors can be used to prepare the composites described in this invention. Linear and nonlinear optical polymers are included herein or monomers which can be polymerized to the corresponding polymers. This includes elastomers, thermoplastics, and thermosets. More specifically, this includes polydiacetylenes, polystyrene and copolymers of styrene, acrylic resins especially polymethylmethacrylate, vinyl polymers, chlorine-containing polymers, fluorine-containing polymers, sulfur-containing polymers especially polythiophenes, ethylene polymers and copolymers, propylene polymers and copolymers, linear condensation plastics, thermosetting resins, cellulose plastics, polypyrroles, polypeptides, polyurethanes, and silicone polymers. If the procedure requires a monomer which is subsequently polymerized, it is imperative to use an unsaturated monomer, preferably a monomer containing a triple bond, which can be subsequently polymerized thermally and/or catalytically.

In the example of Scheme I, the metal was gold and the organic monomer was diphenylbutadiyne (DPBD), a diacetylene, more specifically a diphenyl diacetylene, with phenyl groups on carbon 1 and 4 and one triple bond between carbons 1 and 2 with the second triple bond between carbons 3 and 4.

Crucible 42 was weighed and the apparatus was assembled in the set-up shown in FIG. 1, and then evacuated to $10^{-3}$ to $10^{-4}$ Torr. The crucible was degassed by resistive heating until it glowed red. The pressure in the reaction vessel was monitored and initially rose as the crucible was heated but went back down $10^{-3}$ to $10^{-4}$ Torr after the crucible was properly degassed.

Liquid nitrogen was then introduced into the dewar surrounding the reaction vessel. The walls of reaction vessel reached a temperature of about 77K.

Since diphenylbutadiyne (DPBD) is a solid at room temperature, it was necessary to heat it in order to vaporize it. Vapors of DPBD were introduced into the interior of the reaction vessel and were condensed onto its cold, interior walls. Deposition of DPBD was continued for about 10 minutes until a layer of DPBD was formed on the interior walls of the reaction vessel. The electrical power on the electrodes was slowly turned up to the necessary power for vaporization of gold. Gold vapors were cocondensed with DPBD on the interior walls of the reaction vessel. Cocondensation of the monomer and the metal was continued for a few hours while maintaining the rates of deposition of gold and DPBD constant. Deposition of DPBD monomer on the interior walls of the reaction vessel gives rise to a white matrix whereas polymeric DPBD is brownish in color. Gold clusters can bring color to the matrix on the wall and the color varies depending on its concentration in the matrix. It should be understood that a metal such as gold, can initiate polymerization which is believed to take place when gold comes in contact with the condensed DPBD monomer. A large excess of the DPBD monomer vapors were introduced into the reaction vessel compared to gold vapors in order to minimize aggregation between gold atomic clusters.

When cocondensation was completed, the power to the resistively heated crucible was turned off and the valve leaking DPBD monomer vapors was closed. The reaction vessel was allowed to warm up to room temperature overnight. After bringing it up to atmospheris pressure, the reaction vessel was opened and the solid material was scraped from its interior walls. The solid material was purified and then chemically and spectroscopically characterized.

When gold atoms were cocondensed with DPBD monomer, a dark brown solid matrix was formed on the interior walls of the reaction vessel. The solid matrix and solutions derived therefrom have been characterized by IR, UV/visible spectroscopies, transmission electron microscopy (TEM), and elemental analysis. The matrix consisted of several components that were separated by the difference in their solubilities.

The components of the matrix included gold clusters, larger than colloidal particles of gold, DPBD monomer, and poly-DPBD. As a first step in the purification process, the matrix was dissolved in toluene and the larger than colloidal particles of gold, i.e., gold particles larger than about 1000 angstroms, were filtered out. Then, a mixture containing hexanes was added to the toluene soluble filtrate which caused precipitation of what was later characterized as $Au_x$/poly-DPBD, i.e., composite of gold clusters dispersed in polymeric DPBD or poly-DPBD.

Based on elemental analysis of several $Au_x$/poly-DPBD composites, a gold volume fraction of about 15% was obtained. This result reflects a significant increase of about two orders of magnitude in the metal volume fraction in $Au_x$/poly-DPBD composites over that of the original matrix and is attributed to the partitioning of the gold clusters with poly-DPBD.

Figure 2A:
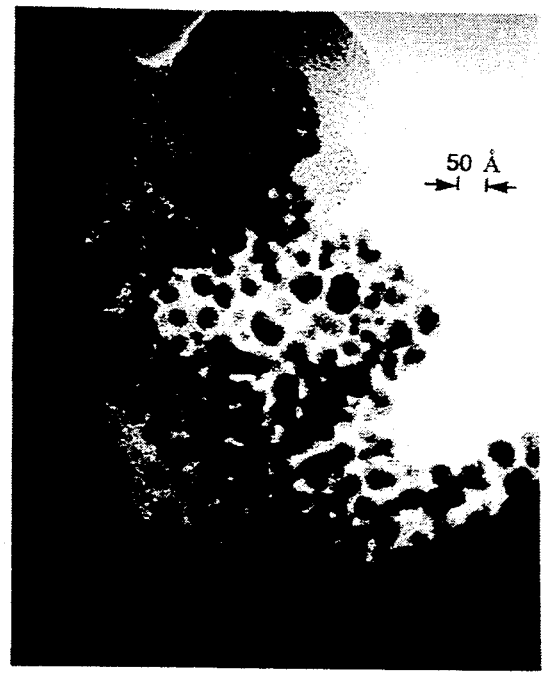
FIG. 2(a) is a micrograph of a transmission electron microscope of a solid $Au_x$/DPBD/poly-DPBD composite as prepared, magnified 800,000 times.
Figure 2B:
FIG. 2(b) is a micrograph of a transmission electron microscope of $Au_x$/poly-DPBD after purification, magnified 200,000 times.

Transmission electron microscopy (TEM) was conducted on solid $Au_x$/DPBD/poly-DPBD matrix as obtained from the reactor and on solutions derived from the matrix. The solid $Au_x$/DPBD/poly-DPBD matrix scraped from the reactor was composed of gold clusters in solid unreacted DPBD and solid poly-DPBD. The TEM samples were prepared by finely grinding the matrix and placing the resulting powder directly on the TEM grid. The grinding did not affect the gold cluster size. FIG. 2(a) is a micrograph of the solid $Au_x$/DPBD/ poly-DPDB matrix from the reactor with a magnification of 800,000. An average cluster size of about 20 angstroms is estimated. FIG. 2(b) is a 200,000 magnification micrograph of $Au_x$/poly-DPBD composite obtained after exposure to toluene and hexanes during the purification process and sample preparation for TEM measurements. The average cluster size remained a constant at about 20 angstroms, as is evident from FIG. 2(b). It is very common for metal clusters to aggregate into fractal-like structures when colloidal dispersions are dried on a TEM grid. One way to avoid such aggregation is to add a stabilizer, such as gelatin. As evident from FIG. 2(b), it appears that poly-DPBD serves as the cluster stabilizer that prevents aggregation of the gold particles.

Figure 3:
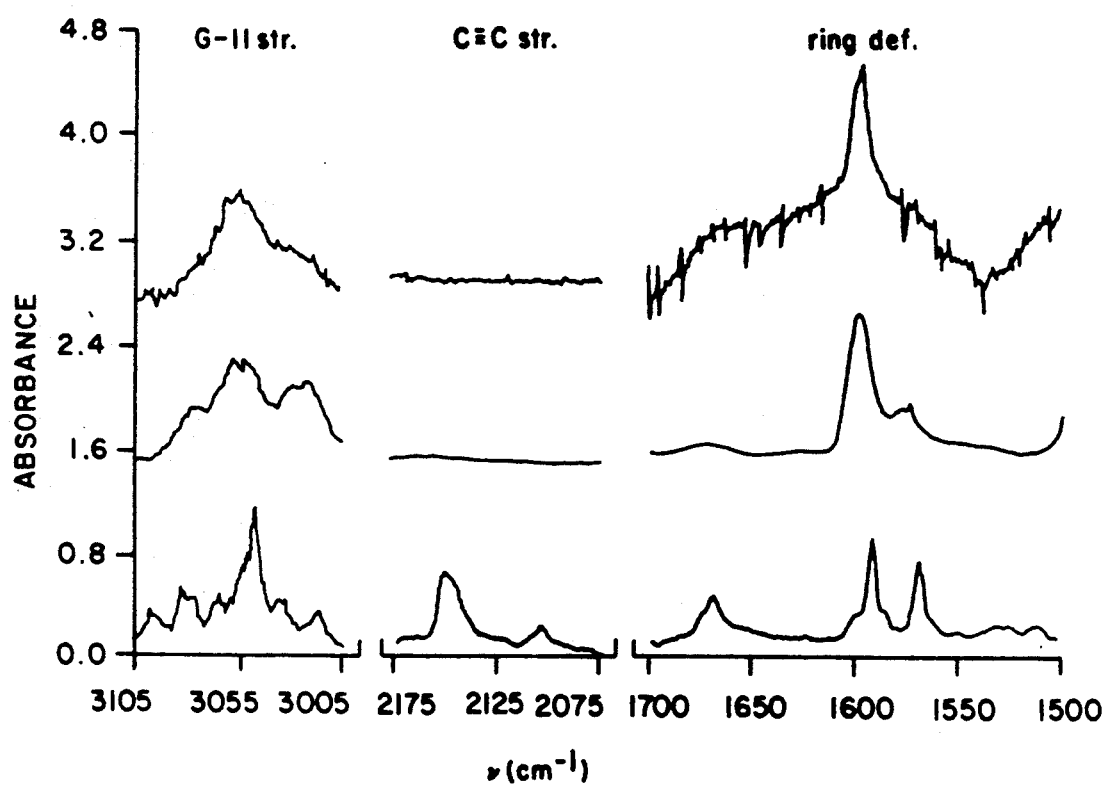
FIG. 3 is a graph of selected regions of the infrared spectra of (a) DPBD, (b) poly-DPBD, and (c) $Au_x$/poly-DPBD.

As shown in FIG. 3, selected regions of IR spectra of DPBD, poly-DPBD, and $Au_x$/poly-DPBD were taken on a Nicolet FTIR spectrometer. These spectral regions show C—H and C≡C stretching modes and the ring deformation mode which best exemplify the regions where spectral changes occur upon polymerization of DPBD. The poly-DPBD analyzed here was obtained by thermal polymerization of DPBD at 185° C. The C≡C stretching band at 2154 cm$^{-1}$ for the monomeric diacetylene is absent in the spectra of both poly-DPBD and $Au_x$/poly-DPBD. The entire spectrum of the $Au_x$/poly-DPBD composite compares favorably to that of thermally polymerized DPBD. The complete absence of the C≡C stretching absorption in the $Au_x$/poly-DPBD composite suggests that the ladder form is the preferred structure of the polymer in the gold catalyzed polymerization.

Thermal polymerization of DPBD begins to occur above 130° C. and leads to two forms of poly-DPBD, a polyene structure and a polyacene or ladder structure. The ladder structure is favored by higher polymerization temperature and may be identified by the loss of the triple stretching absorption band.

Pursuant to Scheme II, gold clusters were dispersed in the well characterized non-linear optical diacetylene polymer poly-{5,7-dodecadiyne-1,12-diol--bis[(( N-butoxycarbonyl) methyl) urethane]} referred to hereinafter as 4-BCMU if monomer or as poly-4-BCMU if polymer. The concentration of gold relative to poly-4-BCMU was achieved by adding several solutions of $Au_x$/acetone to the solution of poly-4-BCMU in tetrahydrofuran until a gold to poly-4-BCMU ratio of 1:1 by weight was reached. Since poly-4-BCMU is not readily soluble in acetone, which was used as the diluent in Scheme II procedure, large volumes of tetrahydrofuran were used to ensure that poly-4-BCMU remained in solution as each successive gold/acetone dispersion was added. The 1:1 by weight $Au_x$/poly-4-BCMU solution was concentrated further by precipitating the $Au_x$/poly-4-BCMU composite with methanol and then dissolving the composite in a minimum amount of tetrahydrofuran.

The third-order nonlinear optical coefficient of the $Au_x$/poly-4-BCMU composite was measured by degenerate four-wave mixing at 1.064 um. For a composite with a gold cluster metal volume fraction of 7%, a 200 enhancement over that of pure poly-4-BCMU was observed.

Figure 4A:
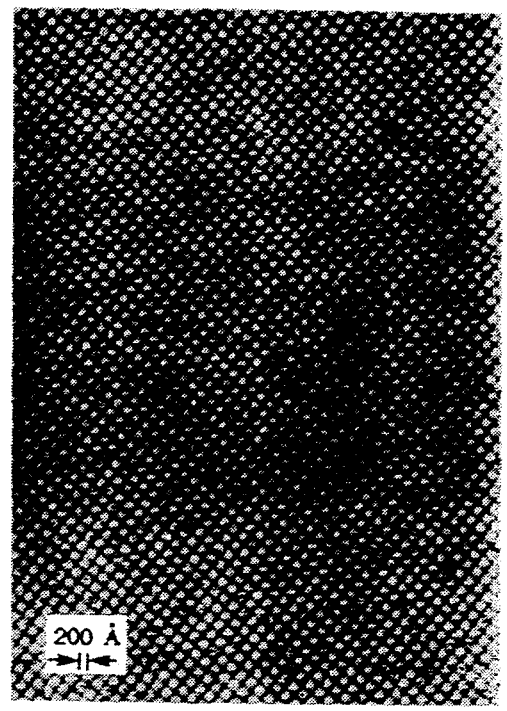
FIG. 4(a) is a micrograph of a transmission electron microscope of $Au_x$/poly-4-BCMU showing the uniform dispersion of the gold clusters in the 4-BCMU polymer.
Figure 4B:
FIG. 4(b) is a micrograph of a transmission electron microscope magnified 50,000 times of $Au_x$/acetone composite showing extensive aggregation.

FIG. 4(a) shows the TEM micrograph of $Au_x$/poly-4-BCMU composite where the gold clusters of about 40 angstroms are substantially uniformly distributed in poly-4-BCMU. FIG. 4(b) is a TEM micrograph of $Au_x$/acetone which shows extensive aggregation of the gold clusters. Based on what is shown in FIGS. 4(a) and 4(b), poly-4-BCMU appears to be effective in preventing aggregation of the gold clusters in solution.

What is claimed is:

1. Optically nonlinear composite comprising metal clusters substantially uniformly dispersed in a non-particulate polymer, wherein metal volume of said metal clusters in said polymer exceeds 1% and is as high as 25%, wherein said composite has a third order optical response, wherein said metal clusters are from about 10 to about 200 angstroms in diameter, and wherein said polymer is selected from linear and nonlinear optical polymers.

2. Composite of claim 1 wherein said polymer is selected from polydiacetylenes, polystyrene, copolymers of styrene, acrylic resins, ethylene polymers and copolymers, propylene polymers and copolymers, cellulose plastics, polypyrroles, polypeptides, polyurethanes, silicon polymers, and mixtures thereof; said metal clusters are composed of metal selected from silver, gold, platinum, nickel, palladium, rhodium, iridium, copper, aluminum, gallium, zinc, cadmium, and mixtures thereof.

3. Composite of claim 1 wherein said polymer is a polymer of a monomer containing triple bond which monomer is vaporizable and condensable, and wherein said metal clusters contain a noble metal.

4. Composite of claim 1 wherein said polymer is selected from polydiacetylenes; said metal clusters are composed of a noble metal, and said metal clusters have metal volume fraction in said polymer of about 2 to 20%.

5. Composite of claim 1 wherein said polymer is selected from polydiphenylbutadiyne, poly-{5,7-dodecadiyne-1,12-diol-bis ((n-butoxycarbonyl)methyl)urethane}, polystyrene, and polymethylmethacrylate; said metal clusters are composed of noble metal; said metal clusters have metal volume fraction in said composite of about 2 to 20%; and said polymer is responsible for the substantially uniform distribution of said metal clusters in said polymer.

* * * * *